United States Patent
Qin et al.

(10) Patent No.: US 11,260,888 B2
(45) Date of Patent: Mar. 1, 2022

(54) METHOD AND SYSTEM FOR HEALTH ASSESSMENT OF A TRACK CIRCUIT AND/OR OF A TRACK SECTION

(71) Applicant: ALSTOM Transport Technologies, Saint-Ouen (FR)

(72) Inventors: Song Qin, Melbourne, FL (US); Nenad Mijatovic, Melbourne, FL (US); Jeffrey Fries, Grain Valley, MO (US)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 442 days.

(21) Appl. No.: 16/193,444

(22) Filed: Nov. 16, 2018

(65) Prior Publication Data

US 2020/0156674 A1   May 21, 2020

(51) Int. Cl.
  *B61K 9/08*   (2006.01)
  *G01R 31/50*   (2020.01)
(52) U.S. Cl.
  CPC .............. *B61K 9/08* (2013.01); *G01R 31/50* (2020.01)
(58) Field of Classification Search
  CPC .......... B61L 1/18; B61L 1/185; G06K 9/6223
  See application file for complete search history.

(56) References Cited

U.S. PATENT DOCUMENTS 3,870,952 A * 3/1975 Sibley .................... B61L 1/187
                                                              324/693
5,769,364 A * 6/1998 Cipollone ............... B61L 1/188
                                                              246/121

| | | | |
|---|---|---|---|
| 2007/0083513 A1* | 4/2007 | Cohen .................... | G06F 11/008 |
| 2016/0299007 A1* | 10/2016 | Kleczewski ............ | G01J 3/453 |
| 2017/0019193 A1* | 1/2017 | Pratt ..................... | H04B 7/0851 |
| 2017/0286838 A1* | 10/2017 | Cipriani ................. | G06N 20/00 |
| 2018/0116597 A1* | 5/2018 | Yu ......................... | A61B 5/0245 |
| 2019/0050669 A1* | 2/2019 | Heshmat Dehkordi ..... | |
| | | | G06K 9/522 |

OTHER PUBLICATIONS

Government of India Ministry of Railways, DC Track Circuit, Center for Advanced Maintenance, Technology, available at http://122.252.243.98/Departments/snt/CAMTECH%20Notes/DCTC%20pam%20ver1.pdf (Year: 2001).*

Tang, A Pattern Recognition Approach to Acoustic Emission Data Originating from Fatigue of Wind Turbine Blades, Sensors 2017, 17, 2507; doi: 10.3390/s17112507 (Year: 2017).*

* cited by examiner

*Primary Examiner* — Michael J Dalbo
(74) *Attorney, Agent, or Firm* — Pearne & Gordon LLP

(57) ABSTRACT

A method and system for health assessment of a track circuit and/or of a track section, the track circuit being configured for detecting the presence of a vehicle on the track section between a transmitting end and a receiving end of the track circuit. The method, implemented by an electronic device, comprises obtaining, from a sensor device placed near the receiving end, samples of an electrical parameter of an electric signal transmitted between the transmitting end and the receiving end of the track section, forming a temporal series of received samples, applying an automatic clustering algorithm to separate the received samples in a predetermined number of clusters, selecting one of the clusters and determining, for the selected cluster, a first peak value of the received samples classified within the selected cluster, and calculating a track circuit health indicator depending on the first peak value determined for the selected cluster.

13 Claims, 3 Drawing Sheets

METHOD AND SYSTEM FOR HEALTH ASSESSMENT OF A TRACK CIRCUIT AND/OR OF A TRACK SECTION

FIELD OF THE INVENTION

The present invention concerns a method and a system for health assessment of a track circuit and/or of a track section, the track circuit being designed for detecting the presence of a vehicle on the track section.

The invention belongs to the field of railway operating and maintenance.

BACKGROUND OF THE INVENTION

It is known that detecting the presence of vehicles, in particular trains, on railway tracks is critical for railway signaling systems, and is therefore an important component of railway infrastructures security.

Track circuits are designed for detecting the presence of vehicles, in particular trains, on tracks of a track section. A track circuit is an electrical circuit using tracks and relays, for transmitting DC electric signals from a first end, also called transmitting end of the track circuit to a second end, also called receiving end of the track circuit. When a train is present on a track section belonging to the track circuit, the wheels and the axle of the train induce a short-circuit, therefore no electric signal is received at the receiving end of the track circuit, indicating the presence of a train. Current sensor devices such as ammeters are installed on both ends of the track circuit to record the current values of the transmitted signal at the transmitting end and the received signal at the receiving end of the track circuit. The current values form samples of an electric signal. By extracting different information from the recorded sample values, it is possible to estimate the degradation/health condition of the railway track section or track circuit, and calculate the accuracy of train detection.

It is known to transmit a modulated signal in the form of pulses with different pulse features in order to carry different information, which causes sample values of the pulses received at the receiving end to be heterogeneous. Furthermore, due to environment conditions and track degradation, the received pulses are also noisy.

The received noisy and heterogeneous samples are not applicable for further data analysis, in particular cannot provide a reliable assessment of the track circuit health.

There is a need to improve the track circuit health assessment.

SUMMARY OF THE INVENTION

This and other objects are achieved by a method for health assessment of a track circuit and/or of a track section, the track circuit being configured for detecting the presence of a vehicle on the track section between a transmitting end and a receiving end of the track circuit, the method being implemented by an electronic device, and comprising:
  obtaining, from a sensor device placed near the receiving end, samples of an electrical parameter of an electric signal transmitted between the transmitting end and the receiving end of the track section, forming a temporal series of samples,
  applying an automatic clustering algorithm to separate the received samples in a predetermined number of clusters,
  selecting one of said clusters and determining, for the selected cluster, a first peak value of the received samples classified within the selected cluster, and
  computing a track circuit health indicator depending on the first peak value determined for the selected cluster.

In embodiments of the invention, the method for health assessment of a track circuit comprises one or more of the following features, considered alone or according to all technically possible combinations.

The method further comprises:
  obtaining, from a sensor device placed near the transmitting end, samples of the electrical parameter of the electric signal transmitted between the transmitting end and the receiving end of the track circuit, forming a temporal series of transmitted samples,
  applying the automatic clustering algorithm to separate the transmitted samples in a predetermined number of clusters,
  selecting one of said clusters and determining, for the selected cluster, a second peak value of the transmitted samples classified within the selected cluster, wherein the track circuit health indicator further depends on the second peak value.

The automatic clustering algorithm applied is a k-means algorithm.

The method further comprises, before applying the k-means algorithm, automatically computing a number K of clusters to use for classifying the temporal series of samples.

The automatic clustering algorithm comprises computing a P-dimensional feature vector associated to each sample of the temporal series of samples.

The automatic clustering algorithm further comprises:
  a) obtaining K centroids, each centroid being associated to a cluster,
  b) computing a distance between each feature vector and each centroid, and assigning the feature vector to a cluster associated to the closest centroid according to the distance computed;
  c) for each cluster, obtaining an updated centroid computed as a mean value of all feature vectors assigned to the cluster associated to the centroid,
  d) repeating steps b) and c) until a stop criterion is met.

The method further comprises obtaining a first voltage value of the electric signal at the receiving end and a second voltage value of the electric signal at the transmitting end.

The track circuit health indicator is a ballast resistance and/or a rail resistance.

The electrical parameter is a current, the received samples are received current samples, the transmitted samples are transmitted current samples, the first peak value is a first peak current value and the second peak value is a second peak current value.

The track circuit health indicator is a ballast resistance, expressed in Ohms per thousand feet and computed by the following formula:

$$R_{ballast} = \frac{TL \times (V_{tx} + V_{rx})}{2 \times 1000 \times (I_{tx} - I_{rx})}$$

where TL is the track section length, $V_{rx}$ is a first voltage value of the electric signal at the receiving end, $T_{tx}$ is a second voltage value of the electric signal at the transmitting end, $I_{rx}$ is the first peak current value and $I_{tx}$ is the second peak current value.

The track circuit health indicator is a rail resistance, expressed in Ohms per feet and computed by the following formula:

$$R_{rail} = \frac{2 \times (V_{tx} - V_{rx})}{TL \times (I_{tx} + I_{rx})}$$

where TL is the track section length, $V_{rx}$ is a first voltage value of the electric signal at the receiving end, $V_{tx}$ is a second voltage value of the electric signal at the transmitting end, $I_{rx}$ is the first peak current value and $I_{tx}$, is the second peak current value.

The invention relates also to a system for health assessment of a track circuit and/or of a track section, the track circuit being configured for detecting the presence of a vehicle on the track section between a transmitting end and a receiving end of the track circuit, comprising an electronic device comprising at least one processor configured to:—
obtain, from a sensor device placed near the receiving end, samples of an electrical parameter of an electric signal transmitted between the transmitting end and the receiving end of the track section, forming a temporal series of samples,
apply an automatic clustering algorithm to separate the received samples in a predetermined number of clusters,
select one of said clusters and determine, for the selected cluster, a first peak value of the received samples classified within the selected cluster, and
compute a track circuit health indicator depending on the first peak value determined for the selected cluster.

BRIEF DESCRIPTION OF THE DRAWINGS

Further characteristics and advantages of the present invention will become apparent from the following description, provided merely by way of non-limiting example, with reference to the enclosed drawings, in which.

DETAILED DESCRIPTION OF EMBODIMENTS

Figure 1:
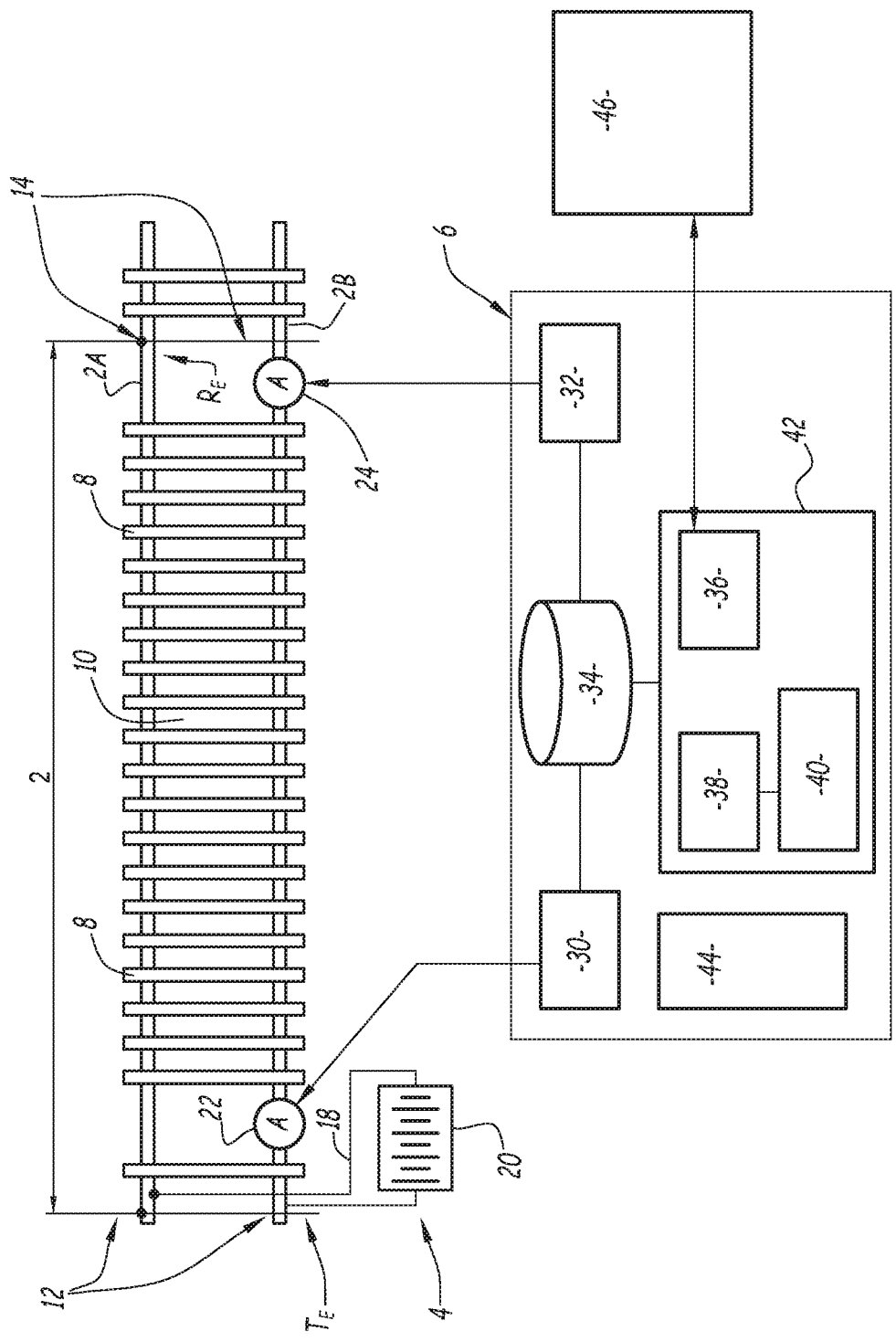
FIG. 1 shows a track circuit with a corresponding track section and a system for health assessment according to an embodiment of the present invention.

FIG. 1 illustrates schematically an example of a track section 2 belonging to a track circuit 4, and a health assessment system 6 according to an embodiment of the invention.

The track section 2 is a portion of a railway track, for example formed by two parallel rails 2A and 2B as shown, suitable for forming a road for railway vehicles, e.g. trains. The rails 2A, 2B are fixed using railway sleepers 8 placed on ballast 10.

Classically, the rails 2A, 2B are made of an electrically conducting metal, for example steel.

The track section 2 is comprised between a first insulating joint 12 and a second insulating joint 14. In the example shown, each insulating joint 12, 14 encompasses the two parallel rails 2A and 2B forming the track.

The first insulating joint 12 defines a first end, also called transmitting end $T_E$ of the track circuit 4 and the second insulating joint 14 defines a second end, also called receiving end $R_E$ of the track circuit 4.

The track circuit 4 further comprises an electric signal generator and modulator 20 schematically represented as a single unit, configured to generate, from a direct current (abbreviated as DC) electric signal power source, modulated electric signals, coded to carry information. The modulated electric signals are obtained by turning on and off a power generator at a given rate called modulation frequency, the purpose of modulation being to carry information. A modulated electric signal is formed by a series of pulses.

The pulses are characterized by several pulse features: pulse center frequency, pulse bandwidth, pulse duration or width, and time between pulses.

In an embodiment, two different pulse widths are applied and therefore two types of pulses are generated, and transmitted.

The electric signal generator and modulator 20 is connected by two conducting branches to each conducting rail 2A, 2B.

The track circuit 4 may include switches and relays which are conventional and are not represented in the FIG. 1.

When there is no train on the track section 2, an electric signal circulates in the circuit created by the connection of the generator and modulator 20 to the conducting rails of the track section, between the first insulating joint 12 and the second insulating joint 14. A modulated electric signal transmitted from the transmitting end $T_E$ is received at the receiving end $R_E$.

When a train is present of the track section 2, the wheels and axle of the train achieve a short-circuit and no electric signal is received at the receiving end $R_E$ of the track circuit 4.

In order to measure the current amplitude, two current sensor devices 22 and 24, for example ammeters, are placed respectively near the transmitting end $T_E$ of the track circuit and near the receiving end $R_E$ of the track circuit, i.e. at a given proximity to the respective insulating joints 12 and 14. For example, each current sensor device is placed at a distance comprised between 0 meter to 10 meters from the insulating joint.

Each current sensor device is configured to measure temporal series of current samples, corresponding respectively to the current values of the transmitted or received electrical pulses.

In an embodiment, the modulated electric signal transmitted between the transmitting end and the receiving end of the track circuit is composed of several types of pulses generated with different pulse features.

In some embodiments, the track circuit 4 includes several types of sensors such as current, voltage and power sensors. Each sensor device is configured to measure temporal series of current, voltage or power samples.

Preferably, the sample values are captured during a period of given duration, for example, 2 seconds, and are in addition uniformly sampled (with minimal resolution of 1 ms) and ordered in the form of temporal series of samples values.

Depending on the embodiments, the sampling and ordering operations are performed either by the measuring devices or in Data Acquisition Units (DAUs) 30, 32 of the health assessment system which in this case include an analogue-to-digital converter and a processor.

Figure 2:
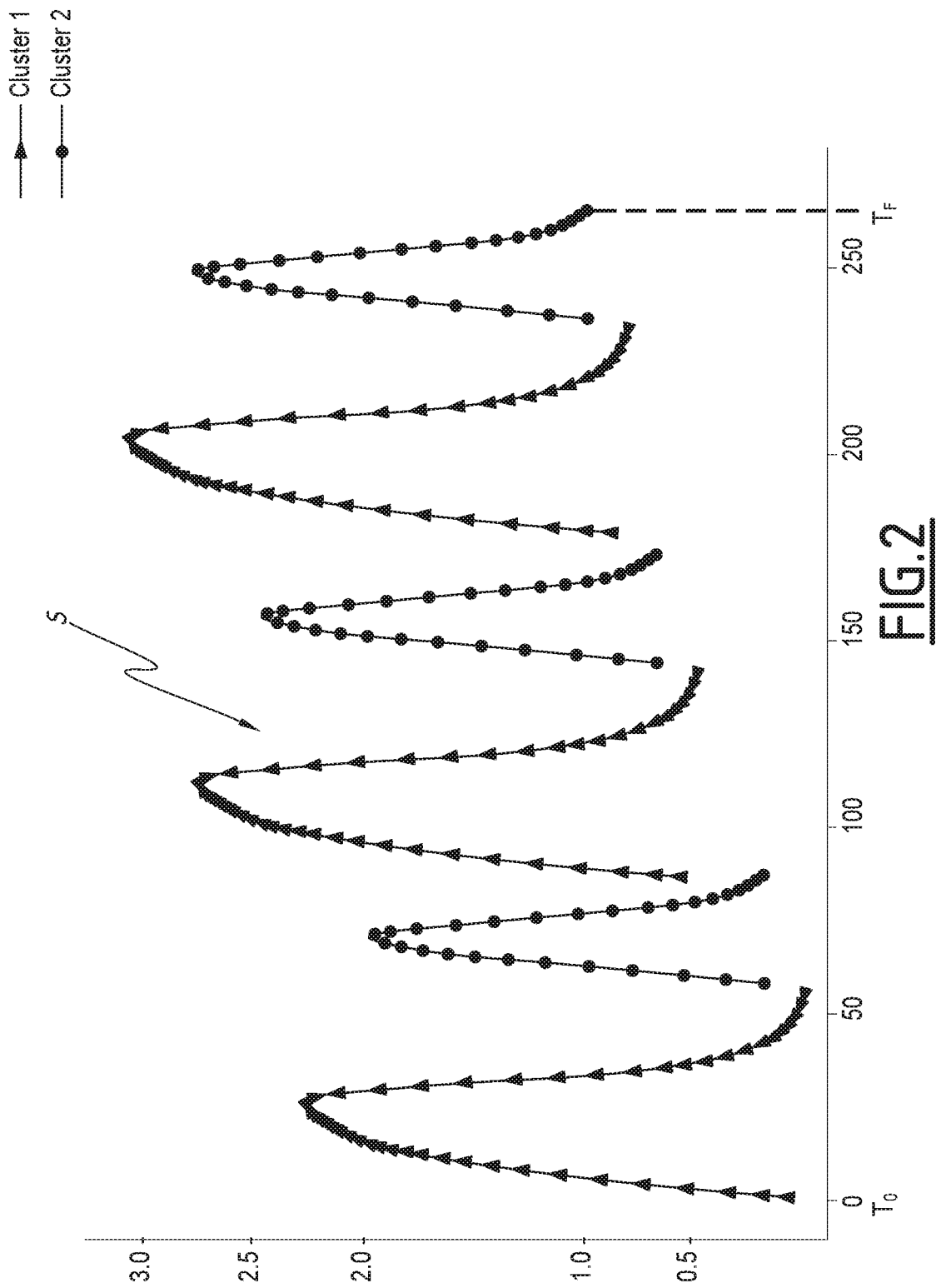
FIG. 2 shows an example of a series of received current samples classified into two clusters.

FIG. 2 shows a temporal series S of current samples obtained between a first instant $T_0$ and a second instant $T_F$, forming a period of 270 ms, the horizontal axis showing the time (in milliseconds) and the vertical axis showing current values (in A).

In the example, the series S is actually composed of current samples from two types of pulses of different pulse widths.

It is proposed to apply a k-means clustering algorithm to automatically classify the current samples into two clusters, referenced Cluster 1 and Cluster 2 in this example and indicated with a triangular reference for the samples belonging to Cluster 1 and a disk reference for the samples belonging to Cluster 2.

The clustering algorithm is applied by the health assessment system 6, an embodiment of which is shown in FIG. 1.

The health assessment system 6 is an electronic system comprising one or several Data Acquisition Units (DAU). In the example of FIG. 1, the health assessment system 6 comprises two DAU 30, 32.

The DAU 30 is configured to collect current samples from the current sensor device 22 placed at the transmitting end of the track circuit. These current samples are called transmitted current samples.

The DAU 32 is configured to collect current samples from the current sensor device 24 placed at the receiving end of the track circuit. These current samples are called received current samples.

Each DAU 30, 32 comprises connectors through which the data exchange is performed, such as USB ("Universal Serial Bus") connectors, radiofrequency connectors such as WIFI, Bluetooth or modems to connect to Internet.

The collected series of current samples are stored in a database 34.

The health assessment system 6 further comprises a k-means clustering unit 36, a peak detector unit 38 and a health indicator computing unit 40.

In an embodiment, the k-means clustering unit 36, peak detector unit 38 and health indicator computing unit 40 are implemented as software, stored in a memory 42 of the health assessment electronic system 6, and executed by the processor 44. Alternatively, the units 36, 38 and 40 are stored on a non-volatile information recording medium, such as an optical disk, a magneto-optical disk, any type of non-volatile memory (e.g. EPROM, EEPROM, FLASH, NVRAM), a magnetic card or and optical card.

In an alternative embodiment, each of the units 36, 38 and 40 is implemented by a FPGA (Field Programmable Gate Array), or a dedicated integrated circuit such as an ASIC (Applications Specific Integrated Circuit).

The health assessment electronic system 6 is configured to transmit the computed health indicators to a rail maintenance center 46. In an embodiment, the transmission is carried out via radiofrequency connectors, using a wireless communication protocol. In a variant, the health assessment electronic system 6 is situated within a rail maintenance center and the transmission is carried out by a wired connection.

A health indicator of the track circuit is a parameter having a value representative of a level of degradation of the track circuit 4 or of a part of the track circuit 4, for example the track section 2.

The computed health indicators are used to apply predictive maintenance, for example by recording successive values of each health indicator computed is it possible to accurately predict a track-circuit failure or a track section degradation before an actual failure, and to apply corrective measures to prevent failures.

Figure 3:
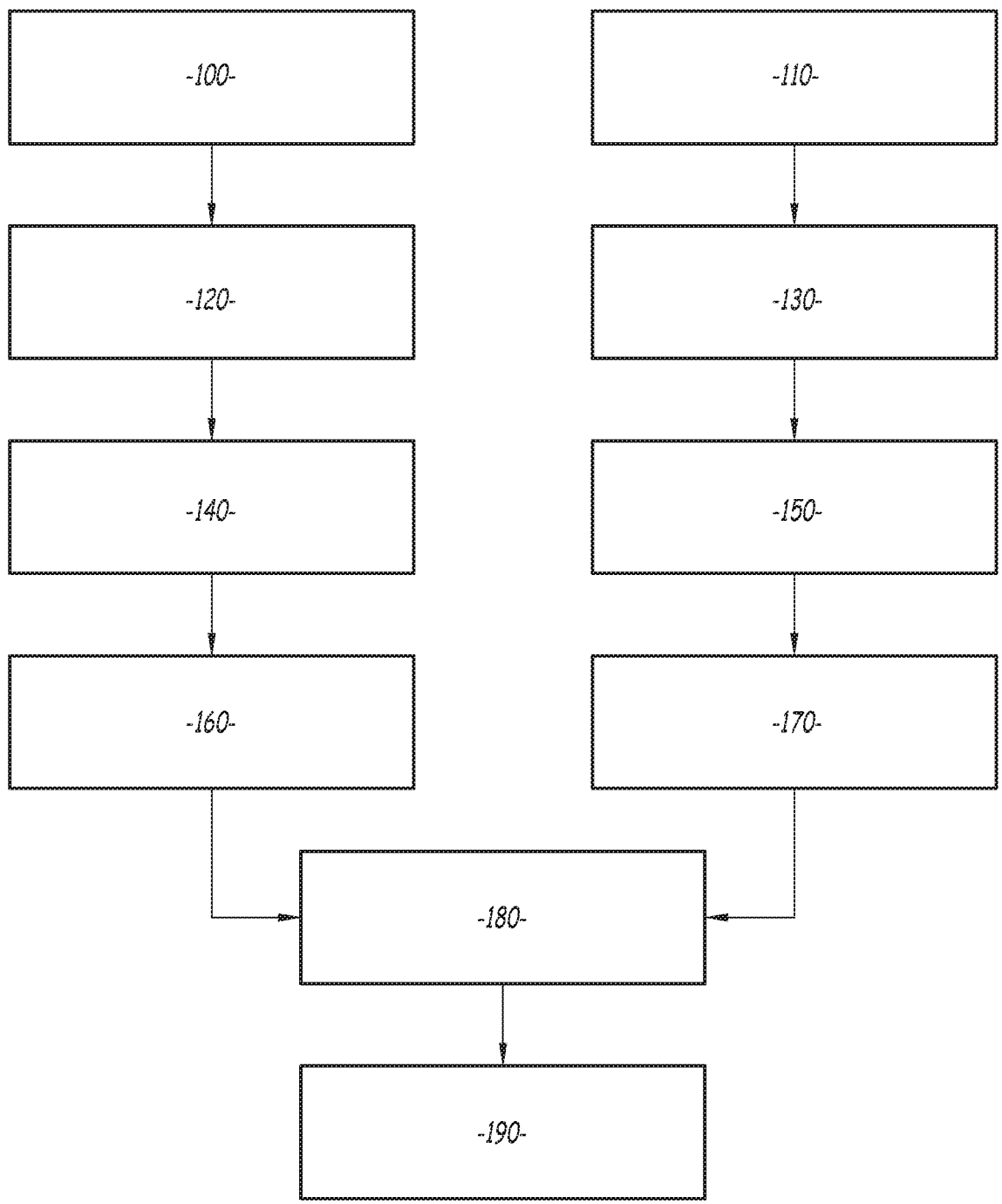
FIG. 3 shows steps of a method for health assessment of a track circuit according to an embodiment of the present invention.

FIG. 3 shows steps of a method for health assessment of a track circuit according to an embodiment.

In the embodiment of FIG. 3, analogous steps, performed on temporal series of current samples from the transmitting end and from the receiving end, are shown.

In a first step 100, a temporal series of current samples are obtained from a current sensor device placed near the receiving end.

An analogous step 110 is carried out to obtain a temporal series of current samples from a current sensor device placed near the transmitting end.

For example, in an embodiment, the samples are obtained from payload packets formatted according to a communication protocol, for example UDP ("User Datagram Protocol") packets. Each UDP packet consists of 1 to 2 pulses, where each pulse consists of a number of temporal samples, for example, 43.

Next, the temporal series of samples is processed in feature extraction step 120 to obtain estimated pulse features.

The processing comprises comparing each current sample value to a current threshold value. For example, for current samples comprised between 0 and 3.5 A, the threshold value is set to 1 A.

The current sample values above the threshold are used to compute estimated peak amplitude (maximum value of samples above the threshold, for example, 2.3 A) and pulse width (number of samples above the threshold, for example, 20). One peak amplitude and one pulse width are computed for each pulse. To carry out a clustering algorithm, we need a minimum of 1000 to 2000 pulses.

In a variant, before estimating the pulse features, train moves data is filtered out, based on a track occupancy flag provided by the track circuit software. For example, a flag with value 1 indicates that the track is occupied by train and a flag with 0 indicates that the track is not occupied.

A feature extraction step 130, analogous to step 120, is carried to obtain estimated features from a temporal series of current samples from the current measuring sensor placed near the transmitting end.

Step 120 (respectively 130) is followed by an automatic clustering step 140 (respectively 150), applied by the k-means clustering unit 36, to separate the received current samples into a predetermined number of clusters, each cluster corresponding to current samples of pulse of a same type.

In the preferred embodiment k-means clustering is applied, with a predetermined number of clusters K.

The k-means clustering algorithm is applied on P-dimensional vectors of features, each vector of feature being associated with a current sample or a sub-group of current samples of the series of current samples, with P being a positive integer. For example, K=2 for 2 clusters.

For example, in a first embodiment, only the estimated pulse width is used (P=1). In a second embodiment, the peak amplitude and the pulse width are used (P=2).

The k-means algorithm comprises the following steps:
 a) Obtaining K centroids, which are for example randomly chosen at initializing. Each centroid is a P-dimensional vector of feature which is the center of an associated cluster;
 b) Each feature vector is assigned to the cluster associated to the centroid that is closest according to a predetermined distance. For example, Euclidean distance is used. Other distance metrics include Manhattan distance which is computed as absolute difference between coordinates of pair of objects.

c) The mean vector of each cluster is updated after all samples are classified, so as to obtain K updated centroids;

d) The steps b) and c) are repeated until the centroids positions converge in the P-dimensional space, and more generally until a stop criterion is met. For example, the stop criterion may be a predetermined number of iterations. In an alternative embodiment, the stop criterion may be ensuring that the distance in the P-dimensional space of two successive updated centroids associated to the same cluster is less than a given threshold.

The result of the automatic clustering is to obtain clusters of homogeneous samples.

Next, one of the clusters is selected, and a peak current value is computed (step 160, 170) by peak detector unit 38. The peak current value is the maximum current sample value of all samples belonging to the selected cluster.

For example, in an embodiment, the cluster with the smallest centroid value is chosen for the processing at the transmitting end and at the receiving end.

Referring to FIG. 2, for example Cluster 2 is selected, and the peak current value is computed (for example, the peak current value is around 2.75 A in the example of FIG. 2).

One or several health indicators are computed by the health indicator computing unit 40 in next health indicator computing step 180.

Ballast resistance is one of the indicators of the health condition of the track circuit computed in step 180. A low ballast resistance corresponds to a bad health condition, and a high ballast resistance corresponds to good health condition.

The definition of "low resistance" and "high resistance" is obtained for example from experimental data, collected from healthy track sections/track circuits, for example on a new material.

The ballast resistance, expressed in Ohms/1000 feet, is given by the formula:

$$R_{ballast} = \frac{TL \times (V_{tx} + V_{rx})}{2 \times 1000 \times (I_{tx} - I_{rx})} \quad (1)$$

where TL is the track section length, $V_{rx}$ is a first voltage value of the modulated electric signal at the receiving end, $V_{tx}$ is a second voltage value of the modulated electric signal at the transmitting end, $I_{rx}$ is the peak current value at the receiving end as computed in step 160, and $I_{tx}$, is the peak current value at the transmitting end as computed in step 170.

$V_{tx}$ is given by the formula:

$$V_{tx} = V_s - (I_{tx} \times R_{tx})(V) \quad (2)$$

where $V_s$ is the voltage of electric signal generator 20 and $R_{tx}$ is the resistance of the wires connecting the track circuit and the rails at the transmitting end.

$V_{rx}$ is given by the formula:

$$V_{rx} = I_{rx} \times R_{rx}(V) \quad (3)$$

where $R_{rx}$ is the resistance of the wires connecting the track circuit and the rails at the receiving end.

For example, the ballast resistance of a track circuit with the following parameters is 7.6 (Ohms/1000 ft)—
TL=9210 (feet),
$V_s$=2.0 (V),
$R_{tx}$=$R_{rx}$=0.53 (Ohms)
$I_{tx}$=2.46 (A)
$I_{rx}$=1.54 (A)

Rail resistance is another one of the indicators of the health condition of the track circuit computed in step 180. An abnormal rail resistance might correspond to a broken rail condition. The "normal" rail resistance values are obtained for example from experimental data, collected from healthy/new track sections.

The rail resistance, expressed in Ohms/feet, is given by the formula:

$$R_{rail} = \frac{2 \times (V_{tx} - V_{rx})}{TL \times (I_{tx} + I_{rx})} \quad (4)$$

For example, the rail resistance of a track circuit with the following parameters is −6.5E-06 (Ohms/ft)—
TL=9210 (feet),
$V_s$=2.0 (V),
$R_{tx}$=$R_{rx}$=0.53 (Ohms)
$I_{tx}$=2.46 (A)
$I_{rx}$=1.54 (A)

In an embodiment, either only the ballast resistance or only the rail resistance is computed. In a variant, both the ballast resistance and the rail resistance are computed.

In another variant, further track circuit/track section health indicators are computed.

The health indicator(s) are then processed in step 190, for example transmitted to a rail maintenance center and compared to recorded threshold values in order to detect problems and estimates risks of failure, and to apply predictive maintenance.

In an alternative embodiment, the values of voltage and current at the transmitting end of the track circuit are previously stored, and only the values of the voltage and of the peak current amplitude are measured. In this alternative, only the steps 100, 120, 140 and 160 are applied, whereas the peak current amplitude at the transmitting end is obtained from a memory of the health assessment system.

In another alternative embodiment, the number K of clusters applied in the K-means clustering algorithm is not known in advance, but is estimated automatically. For example, several values for K are tested with P-dimensional vectors of features, for example k varying from 1 to 9, and the best K value is chosen based on the within-cluster sum of squares according to the formula:

$$S(k) = \sum_{i=1}^{k} \sum_{x \in C_i} \|x - \mu_i\|^2 \quad (5)$$

Where $C_i$ is the $i^{th}$ cluster among k clusters, and is the centroid of cluster $C_i$, and x is a vector of features belonging to $C_i$.

The computed values S(k) can be plotted, and the chosen value for k is the value K for which the computed plot forms an elbow.

In particular, computing the number of clusters can be applied each time the type of pulses transmitted is changed.

The invention has been described in an embodiment using samples of current pulses of the electric signal transmitted between the transmitting end and the receiving end of the track section. In alternative embodiments, the method for health assessment of a track circuit and/or a track section applies with samples of other electrical parameters of the electric signal transmitted between the transmitting end and the receiving end of the track section.

Advantageously, the proposed method does not require building any reference on the features characterizing the pulses and can adapt automatically to changes in terms of pulse features.

Advantageously, the proposed method achieves automatic clustering of samples belonging to pulses, and therefore the data sets used to compute health indicators are less noisy, and the health indicators computed are more reliable.

The invention claimed is:

1. Method for health assessment of a track circuit and/or of a track section, the track circuit being configured for detecting the presence of a vehicle on the track section between a transmitting end and a receiving end of the track circuit, the transmitting end and the receiving end being associated to respective ends of the track section, the method being implemented by an electronic device, and comprising:

obtaining, from a sensor device placed near the receiving end, samples of an electrical parameter of electric signal pulses transmitted between the transmitting end and the receiving end of the track circuit, forming a temporal series of received samples, processing the temporal series of received samples to obtain estimated pulse features of the received samples, applying an automatic clustering algorithm on the estimated pulse features of the received samples to separate the received samples in a predetermined number of clusters, selecting one of said clusters and determining, for the selected cluster, a first peak value of the received samples classified within the selected cluster, and computing a track circuit health indicator depending on the first peak value determined for the selected cluster.

2. The method of claim 1, further comprising:

obtaining, from a sensor device placed near the transmitting end, samples of the electrical parameter of the electric signal pulses transmitted between the transmitting end and the receiving end of the track circuit, forming a temporal series of transmitted samples, processing the temporal series of transmitted samples to obtain estimated pulse features of the transmitted samples, applying the automatic clustering algorithm on the estimated pulse features of the transmitted samples to separate the transmitted samples in a predetermined number of clusters, selecting one of said clusters and determining, for the selected cluster, a second peak value of the transmitted samples classified within the selected cluster, wherein the track circuit health indicator further depends on the second peak value.

3. The method of claim 2, wherein the electrical parameter is a current, the received samples are received current samples, the transmitted samples are transmitted current samples, the first peak value is a first peak current value and the second peak value is a second peak current value.

4. The method of claim 3, wherein the track circuit health indicator is either:

a ballast resistance, expressed in Ohms per thousand feet and computed by the following formula:

$$R_{ballast} = \frac{TL \times (V_{tx} + V_{rx})}{2 \times 1000 \times (I_{tx} - I_{rx})}$$

where TL is the track section length, $V_{rx}$ is a first voltage value of the electric signal at the receiving end, $V_{tx}$ a second voltage value of the electric signal at the transmitting end, $I_{rx}$ the first peak current value and $I_{tx}$, is the second peak current value; or a rail resistance, expressed in Ohms per feet and computed by the following formula:

$$R_{rail} = \frac{2 \times (V_{tx} - V_{rx})}{TL \times (I_{tx} + I_{rx})}$$

where TL is the track section length, $V_{rx}$ is a first voltage value of the electric signal pulse at the receiving end, $V_{tx}$ is a second voltage value of the electric signal pulse at the transmitting end, $I_{rx}$ is the first peak current value and $I_{tx}$, is the second peak current value.

5. The method of claim 1, wherein the automatic clustering algorithm applied is a k-means algorithm.

6. The method of claim 5, further comprising, before applying the k-means algorithm, automatically computing a number K of clusters to use for classifying the temporal series of samples.

7. The method of claim 5, wherein the automatic clustering algorithm comprises:

computing a P-dimensional feature vector associated to each sample or sub-group of samples of the temporal series of samples.

8. The method of claim 7, wherein the automatic clustering algorithm further comprises:

a) obtaining K centroids, each centroid being associated to a cluster, b) computing a distance between each feature vector and each centroid, and assigning the feature vector to a cluster associated to the closest centroid according to the distance computed;

c) for each cluster, obtaining an updated centroid computed as a mean value of all feature vectors assigned to the cluster associated to the centroid, d) repeating steps b) and c) until a stop criterion is met.

9. The method of claim 1, further comprising obtaining a first voltage value of the electric signal pulse at the receiving end and a second voltage value of the electric signal pulse at the transmitting end.

10. The method of claim 9, wherein the track circuit health indicator is a ballast resistance and/or a rail resistance.

11. System for health assessment of a track circuit and/or of a track section, the track circuit being configured for detecting the presence of a vehicle on the track section between a transmitting end and a receiving end of the track circuit, the transmitting end and the receiving end being associated to respective ends of the track section, the system comprising an electronic device comprising at least one processor configured to:

obtain, from a sensor device placed near the receiving end, samples of an electrical parameter of electric signal pulses transmitted between the transmitting end and the receiving end of the track circuit, forming a temporal series of received samples, process the temporal series of received samples to obtain estimated pulse features of the received samples, apply an automatic clustering algorithm on the estimated pulse features of the received samples to separate the received samples in a predetermined number of clusters, select one of said clusters and determine, for the selected cluster, a first peak value of the received samples classified within the selected cluster, and compute a track circuit health indicator depending on the first peak value determined for the selected cluster.

12. The system of claim 11, wherein the processor is further configured to:

obtain, from a sensor device placed near the transmitting end, samples of the electrical parameter of the electric signal pulses transmitted between the transmitting end and the receiving end of the track circuit, forming a temporal series of transmitted samples, process the temporal series of transmitted samples to obtain estimated pulse features of the transmitted samples, apply the automatic clustering algorithm on the estimated pulse features of the transmitted samples to separate the transmitted samples in a predetermined number of clusters, select one of said clusters and determine, for the selected cluster, a second peak value of the transmitted samples classified within the selected cluster, wherein the track circuit health indicator further depends on the second peak value.

13. The system of claim 12, wherein the electrical parameter is a current, the received samples are received current samples, the transmitted samples are transmitted current samples, the first peak value is a first peak current value and the second peak value is a second peak current value.

* * * * *